(12) United States Patent
Morimoto

(10) Patent No.: US 6,611,004 B2
(45) Date of Patent: Aug. 26, 2003

(54) GALLIUM NITRIDE BASED LIGHT EMITTING ELEMENT

(75) Inventor: Taiji Morimoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/891,365

(22) Filed: Jun. 27, 2001

(65) Prior Publication Data

US 2002/0000558 A1 Jan. 3, 2002

(30) Foreign Application Priority Data

Jun. 27, 2000 (JP) ........................................ 2000-192212

(51) Int. Cl.[7] .............................................. H01L 33/00
(52) U.S. Cl. ............................ 257/99; 257/76; 257/97; 257/103; 257/615
(58) Field of Search ................................ 257/76, 79, 94, 257/96, 97, 99, 103, 615

(56) References Cited

U.S. PATENT DOCUMENTS

| 5,523,589 | A | * | 6/1996 | Edmond et al. | 257/97 |
| 5,905,275 | A | * | 5/1999 | Nunoue et al. | 257/99 |
| 6,150,674 | A | * | 11/2000 | Yuri et al. | 257/103 |
| 6,177,292 | B1 | * | 1/2001 | Hong et al. | 257/103 |
| 6,201,265 | B1 | * | 3/2001 | Teraguchi | 257/99 |

FOREIGN PATENT DOCUMENTS

JP     A6310757     11/1994

* cited by examiner

Primary Examiner—Gene M. Munson
(74) Attorney, Agent, or Firm—Birch, Stewart, Kolasch & Birch, LLP

(57) ABSTRACT

A gallium nitride based light emitting element includes an n type electrode formed on one main surface of an n type gallium nitride substrate, in which the area ratio of the n type electrode with respect to the area of the one main surface is set to be in the range of at least 5% and at most 60%, and the n type electrode includes an n type ohmic electrode layer for introducing current.

6 Claims, 5 Drawing Sheets

FIG.1A
FIG.1B
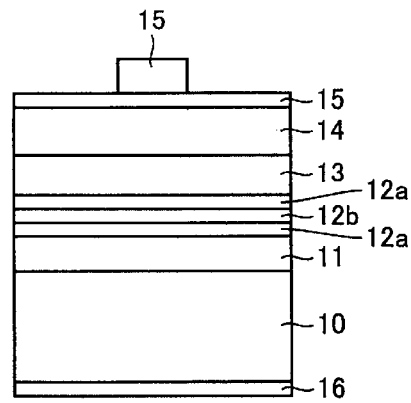
FIG.2A
FIG.2B
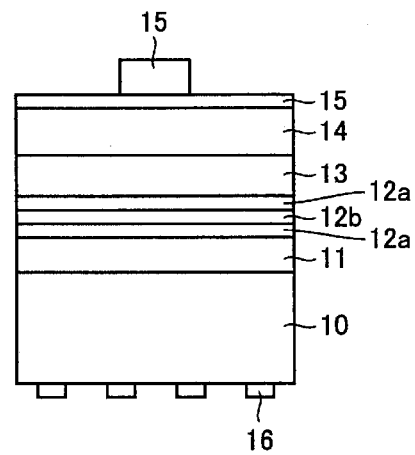
FIG.3A
FIG.3B
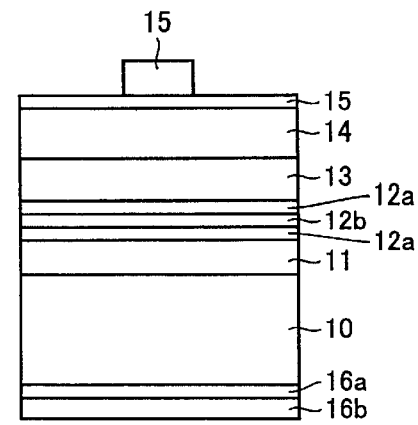

US 6,611,004 B2

GALLIUM NITRIDE BASED LIGHT EMITTING ELEMENT

BACKGROUND OF THE INVENTION

1. Field of the Invention

The present invention relates to a gallium nitride based light emitting element fabricated by using a gallium nitride substrate and, more particularly, to an improvement of an electrode of the light emitting element.

2. Description of the Background Art

Most of the conventional gallium nitride based blue light emitting elements, which have already been practically used, are fabricated by using sapphire substrates. A sapphire substrate, however, is insulative, and therefore, it is necessary to form positive and negative pad electrodes for wire bonding on one same surface of the substrate. This imposes a limit in an attempt to increase the number of chips that can be obtained per one substrate wafer, by reducing the size of the light emitting element chip.

Blue light emitting elements using n type SiC substrates have also been practically used. Here, as a SiC substrate is conductive, it is unnecessary to form both the positive and negative pad electrodes for wire bonding on one same surface of the substrate, and therefore, it is possible to reduce the size of the light emitting chip. There is a lattice constant difference, however, between the SiC substrate and the gallium nitride based semiconductor layer stacked thereon. Therefore, it is necessary to form a buffer layer on the substrate and, in order to obtain a flat crystal surface of the underlying layer, it is necessary to form the underlying layer thick.

In order to solve these problems, the inventors have fabricated a light emitting element using a gallium nitride substrate that is conductive.

Here, as the substrate is conductive, it is unnecessary to form both the positive and negative pad electrodes for wire bonding on one same surface of the substrate, it becomes possible to reduce the size of the light emitting chip, and hence it becomes possible to increase the number of chips obtained per one substrate wafer. Further, there is almost no lattice constant difference between the gallium nitride substrate and the gallium nitride based semiconductor stacked thereon. Therefore, the buffer layer becomes unnecessary and formation of a thick underlying layer becomes unnecessary as well.

Though a light emitting element using a gallium nitride substrate has been realized, a phenomenon is observed in the light emitting element that optical output lowers when conduction is continued for a long period of time.

SUMMARY OF THE INVENTION

Therefore, an object of the present invention is to provide, with satisfactory production efficiency, a gallium nitride based blue light emitting element having high brightness and high reliability.

The gallium nitride based light emitting element in accordance with the present invention includes an n type electrode formed on one main surface of an n type gallium nitride substrate, the ratio of the area of the n type electrode with respect to the area of the one main surface is set in the range of at least 5% and at most 60%, and the n type electrode includes an n type ohmic electrode layer for introducing current.

The n type electrode may further include a supplemental electrode layer that is in electrical contact with the n type ohmic electrode layer. The ohmic electrode layer and the supplemental electrode layer may have different two-dimensional shapes.

The ohmic electrode may be formed of a metal selected from Ti, Sc, La, Y, Hf and Zr. The supplemental electrodes may be formed of a metal selected from Pt, Al, Ag, Au and W.

It is preferred that the thickness of the n type gallium nitride substrate is at least 40 μm. It is preferred that the thickness of the n type electrode formed on the substrate is in the range of at least 0.3 μm and at most 2 μm.

The foregoing and other objects, features, aspects and advantages of the present invention will become more apparent from the following detailed description of the present invention when taken in conjunction with the accompanying drawings.

FIG. 1A is a plan view representing an n type electrode pattern on a rear surface of an n type gallium nitride substrate in a light emitting element in accordance with Embodiment 1 of the present invention, and FIG. 1B is a cross section representing the stacked layer structure of the light emitting element.

FIG. 2A is a plan view representing an n type electrode pattern on a rear surface of an n type gallium nitride substrate in a light emitting element in accordance with Embodiment 2 of the present invention, and FIG. 2B is a cross section representing the stacked layer structure of the light emitting element.

FIG. 3A is a plan view representing an n type electrode pattern on a rear surface of an n type gallium nitride substrate in a light emitting element in accordance with Embodiment 3 of the present invention, and FIG. 3B is a cross section representing the stacked layer structure of the light emitting element.

DESCRIPTION OF THE PREFERRED EMBODIMENTS

Figure 4A:
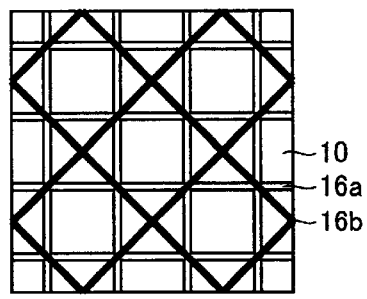
FIG. 4A is a plan view representing an n type electrode pattern on a rear surface of an n type gallium nitride substrate in a light emitting element in accordance with Embodiment 4 of the present invention.

The phenomenon that the light emitting element using the gallium nitride substrate suffers from decrease in optical output after conduction of a long period of time described above was studied by the inventors of the present invention. As a result, it was found that a strain experienced in the light emitting element and particularly near the active layer causes multiplication of crystal defects, increasing non-light emitting areas. Further, it was found that the strain and the defects derived from a problem caused by the new adoption of the gallium nitride substrate, which problem was hardly related to the conventional sapphire substrate.

In fabricating a gallium nitride substrate, generally, a thick GaN substrate layer is epitaxially grown on a different base substrate and, thereafter, the different base substrate is removed. Here, perfect lattice alignment is not attained between the different base substrate and the GaN substrate layer, and hence a particular strain exists in the gallium nitride substrate after the different base substrate is removed.

Further, it was found that stress resulting from the n type electrode metal formed on the rear surface of the n type gallium nitride substrate or stress generated from the change in volume when a conductive adhesive such as Ag paste used for fixing the light emitting element chip on a base is set or change in volume when a metal having low melting point such as In, AuSn or AuSi is solidified is transmitted to the inside of the substrate through the electrode metal, enhancing the strain inherently existing in the gallium nitride substrate.

The strain tends to be transmitted particularly in the n type electrode in the light emitting element using the gallium nitride substrate, as compared with the conventional sapphire substrate, from the following reasons. In the conventional light emitting element using a sapphire substrate, the n type electrode is brought into contact with an n-GaN layer grown on the substrate with a buffer layer interposed. As the n-GaN layer grows only with the buffer layer interposed on the sapphire substrate that has different lattice constant, this layer contains defects as may as $10^9$ cm$^{-2}$ or more. The large number of defects existing in the n-GaN layer serves to relax the strain derived from the electrode, suppressing propagation of the strain into the element. By contrast, the defect density in the n-GaN layer grown on the gallium nitride substrate is suppressed to about 1/100 of the n-GaN layer grown on the sapphire substrate with the buffer layer interposed, to be in the order of $10^7$ cm$^{-2}$ or lower. Thus, the strain resulting from the electrode is not relaxed but tends to be propagated to the inside of the element.

Based on the analysis described above, the inventors considered that the decrease in optical output after conduction experienced in the light emitting element using a gallium nitride substrate possibly resulted from the strain on the element, assumed strain of the electrode metal and the thickness of the gallium nitride thickness, and studied the influences thereof.

Based on the study, attempts were made to reduce the strain caused by the electrode metal, by forming the n type electrode not on the entire rear surface but partially on areas on the n type gallium nitride substrate as shown in FIGS. 1A to 7B, and satisfactory results were obtained in respective attempts.

Further, an attempt was made to reduce the strain experienced in the light emitting element, by selecting the thickness of the n type electrode to be lower than a prescribed value, for example, 2 μm or smaller, and satisfactory result was obtained.

Further, an attempt was made to reduce propagation of the strain to the inside of the light emitting element by selecting the thickness of the substrate to be a prescribed value or higher, for example, at least 40 μm, as regards the particular problem resulting from the method of manufacturing the gallium nitride substrate described above, and the satisfactory result was obtained.

In the following, for convenience of description, the ratio of the area of the n type electrode covering the rear surface of the n type gallium nitride substrate will be defined as "electrode coverage ratio."

From the result of studying the electrode coverage ratio, it was found that reliability of the light emitting element could be improved when the electrode coverage ratio of the n type electrode was set to be smaller than 100%. Particularly, it was found that the effect was marked when the electrode coverage ratio was at most 60%. It was also found, however, that when the electrode coverage ratio of the n type electrode was 5% or lower, the operational voltage of the light emitting element increased significantly, affecting the reliability of the element.

More specifically, the smaller the electrode coverage ratio, the smaller the influence of the strain of the electrode metal, and the less the strain was propagated to the inside of the light emitting element.

As to the strain generated by setting of the conductive adhesive used for fixing the light emitting element on the base or from solidification of the metal having low melting point, the smaller the electrode coverage ratio, the less the strain was propagated to the inside of the element through the electrode.

It was further found that when the thickness of the n type electrode formed on the rear surface of the gallium nitride substrate was set to at most 2 μm, lowering of the optical output while the element was in conduction could be suppressed. The reason for this is that even when the electrode coverage ratio on the rear surface of the substrate is smaller, the amount of electrode strain would be increased if the n type electrode is too thick, introducing much strain into the light emitting element.

Further, it was found that lowering of the optical output while the element was in conduction could be suppressed by setting the thickness of the gallium nitride substrate to be at least 40 μm. This is because there is an effect that the strain from the electrode is relaxed as it propagates through the thick substrate to the inside of the light emitting element. Further, there may be an effect that as the rear surface of the gallium nitride substrate where crystal defects and strain are most abundant is separated, by the large substrate thickness, from the substrate surface with which the epitaxially grown layer is in contact, defects and strains entering the epitaxially grown layer can be reduced.

More specifically, in the gallium nitride based light emitting element in accordance with the present invention, it is preferred to improve reliability of the light emitting element that the electrode coverage ratio of the n type electrode on the rear surface of the n type gallium nitride substrate is 5% to 60%, the thickness of the electrode metal is at most 2 μm and the substrate thickness is at least 40 μm.

As the n type electrode, not only an electrode layer to establish ohmic contact with the substrate but also an electrode structure including a supplemental electrode layer for wire bonding to establish conduction, or to improve wettability with the adhesive adhering a pellet of the light emitting element to the base, may be employed.

In the following, embodiments of the light emitting element using the gallium nitride substrate in accordance with the present invention will be described in greater detail.

FIGS. 1A to 7B represent the two-dimensional structures and the cross sectional structures of the substrate side electrode of the light emitting element using an n type gallium nitride substrate. In these figures, the reference numeral 10 denotes an n type gallium nitride substrate, 11 denotes an n type InGaAlN clad layer, 12a denotes a quantum well layer, 12b denotes a barrier layer, 13 denotes a p type InGaAlN clad layer, 14 denotes a p type InGaAlN contact layer, 15 denotes a p type electrode, 16 denotes an n type electrode layer, 16a denotes an n type ohmic contact electrode layer and 16b, denotes an n type supplemental electrode layer.

FIGS. 1A and 1B represent a structure in which the n type electrode 16 is formed in a lattice.

FIGS. 2A and 2B represent a structure in which the n type electrode 16 is formed as islands.

FIGS. 3A and 3B represent a structure in which a lattice-shaped n type supplemental electrode layer 16b is formed overlapped on the same lattice-shaped n type ohmic contact electrode layer 16a.

Figure 4B:
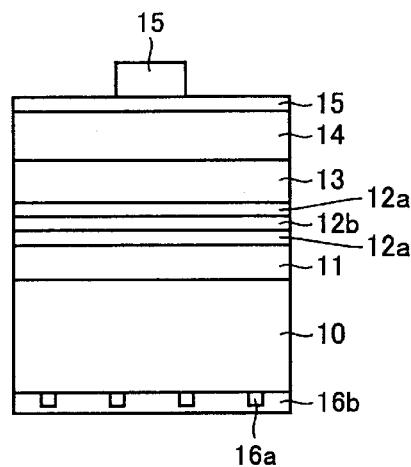
FIG. 4B is a cross section representing the stacked layer structure of the light emitting element.

FIGS. 4A and 4B represent a structure obtained by partially modifying the structure shown in FIGS. 3A and 3B, in which the n type supplemental electrode layer 16b is stacked shifted in angle relative to the n type ohmic contact electrode layer 16a.

Figure 5A:
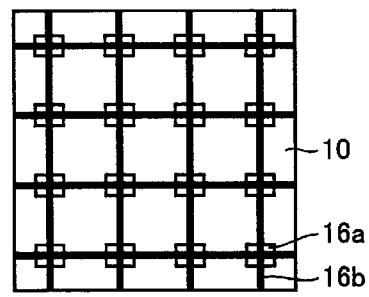
FIG. 5A is a plan view representing an n type electrode pattern on a rear surface of an n type gallium nitride substrate in a light emitting element in accordance with Embodiment 5 of the present invention.
Figure 5B:
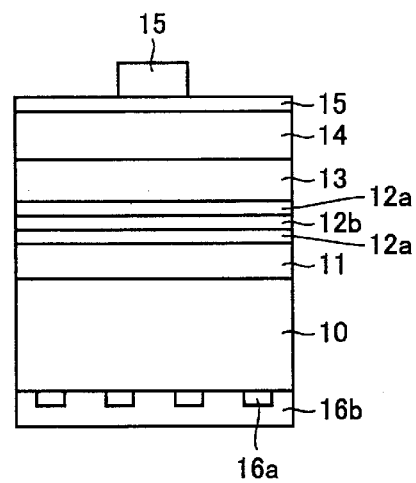
FIG. 5B is a cross section representing the stacked layer structure of the light emitting element.

FIGS. 5A and 5B represent a structure in which lattice-shaped n type supplemental electrode layer 16b is stacked to connect a plurality of rectangular n type ohmic contact electrode layers 16a arranged in an array.

Figure 6A:
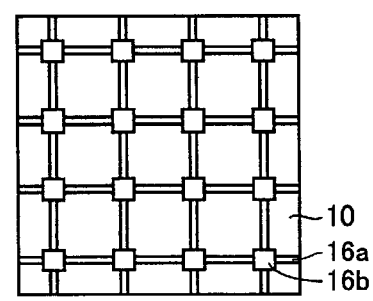
FIG. 6A is a plan view representing an n type electrode pattern on a rear surface of an n type gallium nitride substrate in a light emitting element in accordance with Embodiment 6 of the present invention.
Figure 6B:
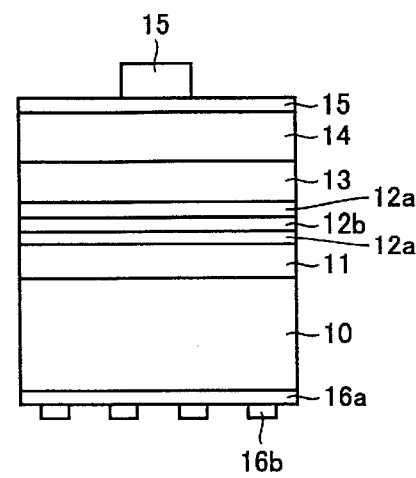
FIG. 6B is a cross section representing the stacked layer structure of the light emitting element.

FIGS. 6A and 6B represent a structure in which the shapes of the n type ohmic contact electrode layer 16a and the n type supplemental electrode layer 16b shown in FIGS. 5A and 5B are reversed.

Figure 7A:
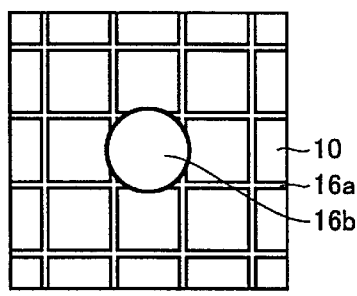
FIG. 7A is a plan view representing an n type electrode pattern on a rear surface of an n type gallium nitride substrate in a light emitting element in accordance with Embodiment 7 of the present invention.
Figure 7B:
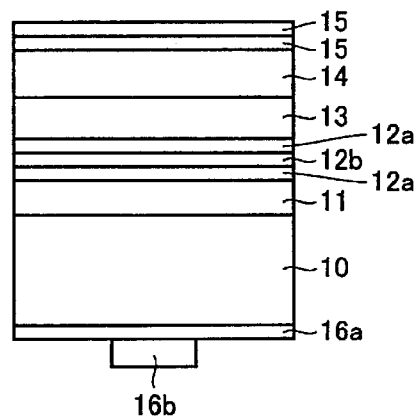
FIG. 7B is a cross section representing the stacked layer structure of the light emitting element.

FIGS. 7A and 7B represents a structure obtained by partially modifying the structure shown in FIGS. 1A and 1B, in which on the side of the n type gallium nitride substrate, a bonding pad 16b for conduction wires is provided in addition to the n type ohmic contact electrode layer 16, and the p side of the light emitting element chip is adhered to the base.

Figure 8:
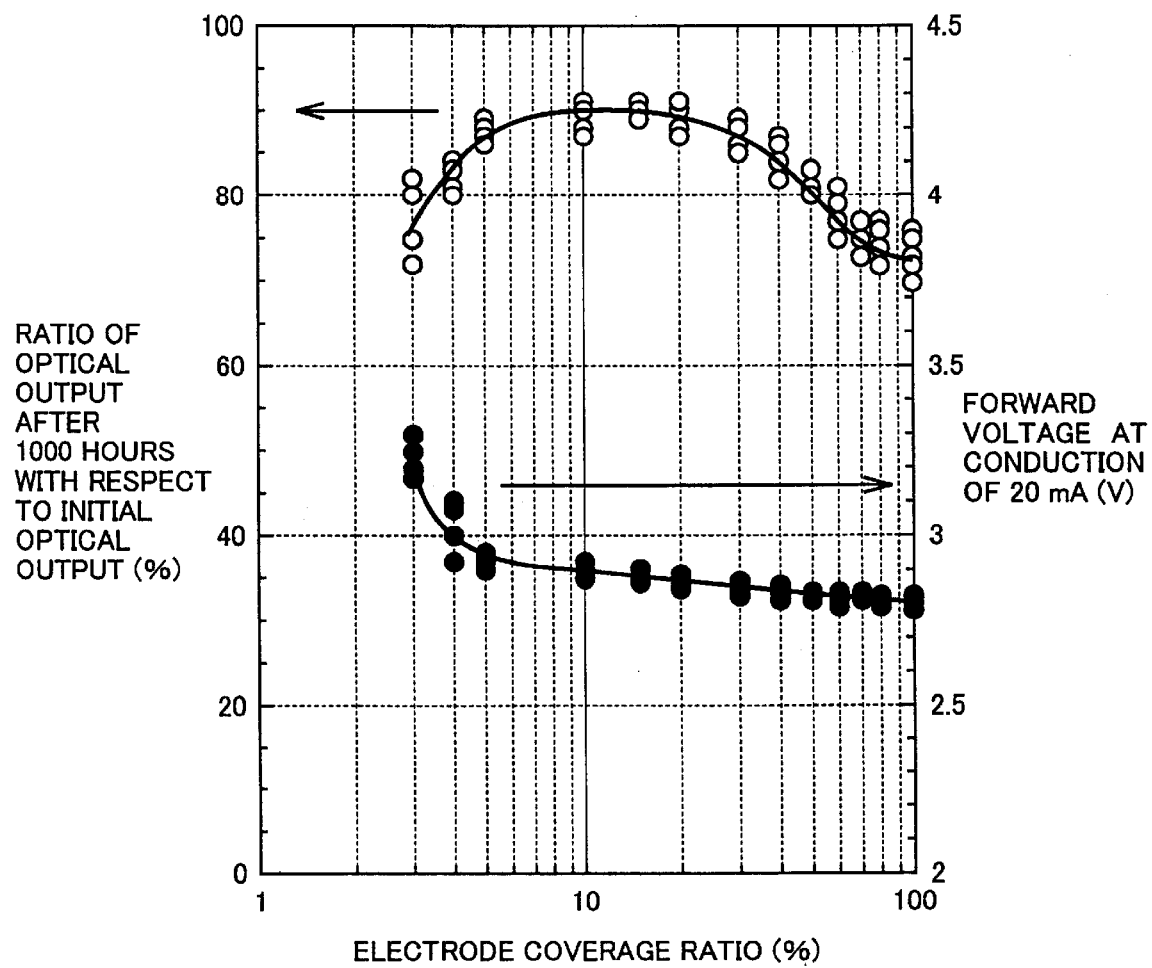
FIG. 8 is a graph representing the ratio of optical output after conduction of 1000 hours to the initial optical output at the start of conduction, and the voltage between terminals with the forward current of 20 mA, with respect to the electrode coverage ratio of the n type electrode.

The graph of FIG. 8 shows the ratio of the optical output after conduction of 1000 hours to the initial optical output at the start of conduction and the voltage between the terminals with the forward current of 20 mA, with respect to the electrode coverage ratio of the n type electrode.

As can be seen from FIG. 8, as the electrode coverage ratio decreases from 100%, lowering of the optical output after the conduction over the long period of time can be suppressed. This effect is particularly marked when the electrode coverage ratio is 60% or smaller.

By contrast, the voltage between the terminals when there is a forward current of 20 mA gradually increases, though slightly, as the electrode coverage ratio decreases. The reason for this is that as the electrode coverage ratio decreases, the current introduction area to the substrate becomes smaller, electrode contact resistance increases, and hence the voltage drop component increased by the increase of the resistance must be compensated for. It was found that when the electrode coverage ratio was 5% or smaller, increase in the voltage between the terminals was significantly large. This is because the electrode contact resistance increases abruptly because of the shape effect of the electrode.

From the results of study described above, it is understood that the electrode coverage ratio should preferably be in the range of at least 5% and at most 60%.

Figure 9:
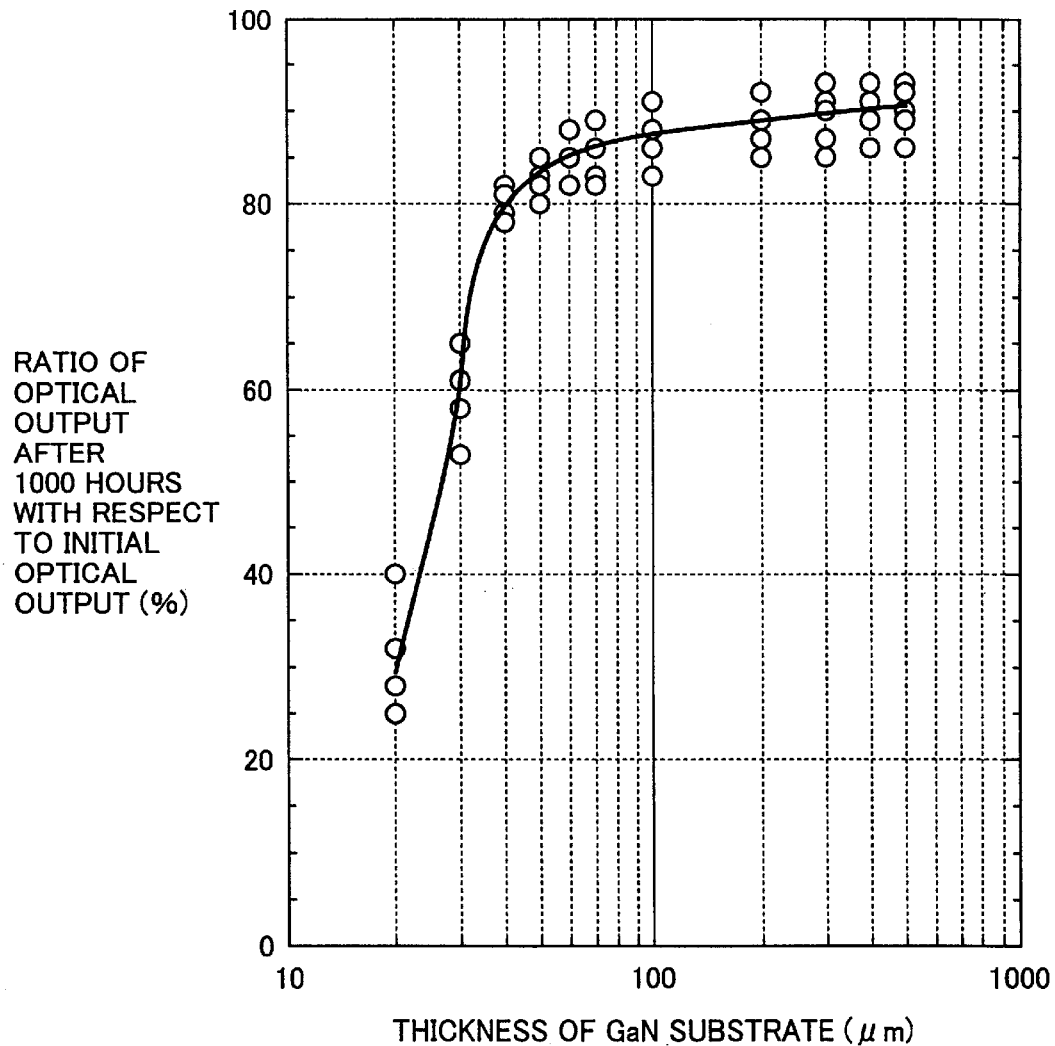
FIG. 9 is a graph representing the ratio of the optical output after conduction of 1000 hours to the initial optical output at the start of conduction, with respect to the thickness of the GaN substrate.

The graph of FIG. 9 represents the ratio of the optical output after conduction for 1000 hours to the initial optical output at the start of conduction, with respect to the thickness of the GaN substrate.

As can be seen from FIG. 9, it is understood that decrease in the optical output after conduction over long period of time can be suppressed when the thickness of the substrate is made 40 $\mu$m or larger.

Figure 10:
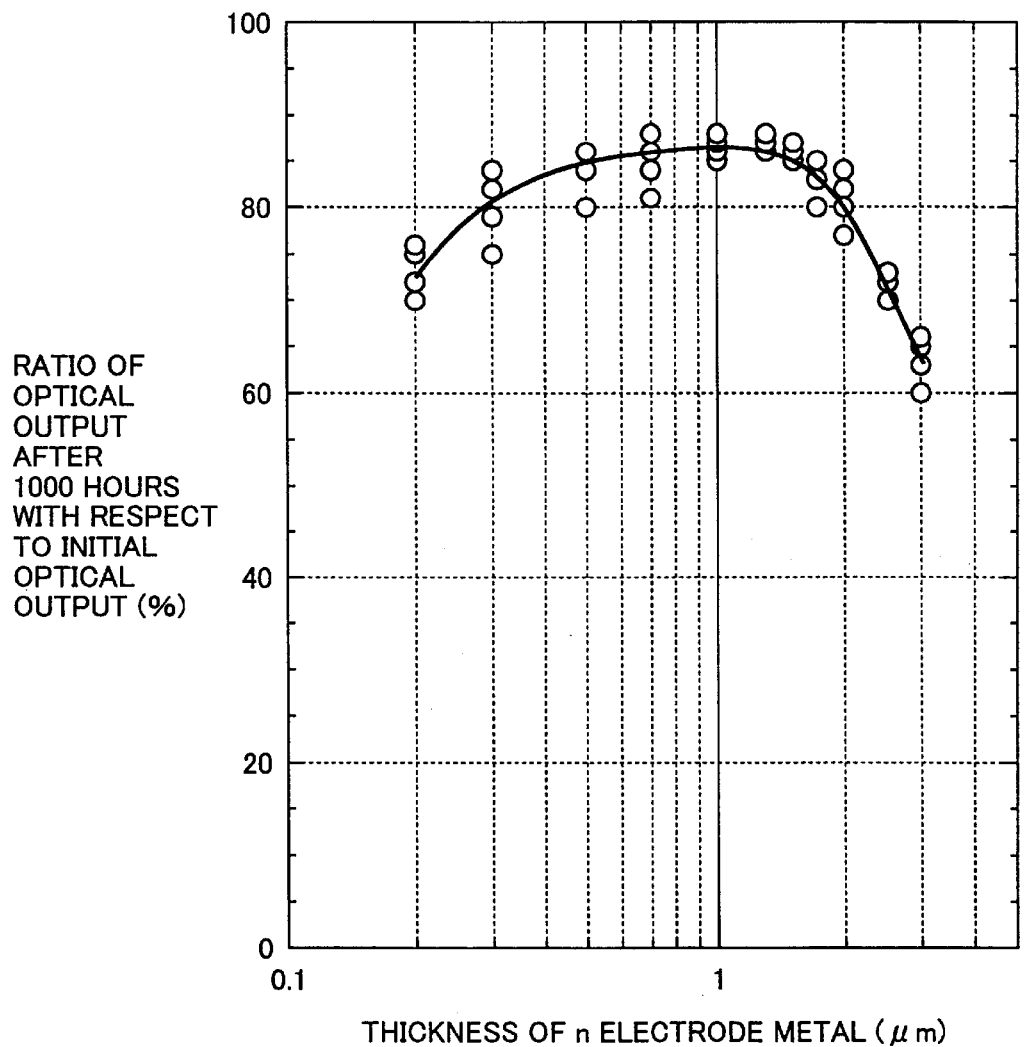
FIG. 10 is a graph representing the ratio of the optical output after conduction of 1000 hours to the initial optical output at the start of conduction, with respect to the thickness of the n type electrode.

The graph of FIG. 10 represents the ratio of the optical output after conduction for 1000 hours to the initial optical output at the start of conduction, with respect to the thickness of the n type electrode.

As can be seen from FIG. 10, it is understood that decrease in the optical output after conduction over long period of time can be suppressed when the thickness of the electrode is selected to be within the range of at least 0.3 $\mu$m and at most 2 $\mu$m.

Embodiment 1

FIG. 1A is a plan view of the gallium nitride based semiconductor light emitting element in accordance with Embodiment 1 of the present invention viewed from the side of the substrate, and FIG. 1B is a cross sectional view showing the stacked layer structure of the light emitting element. In these figures, an n type gallium nitride substrate 10 has a crystallographic c plane as a main surface, and has the thickness of 100 $\mu$m and the diameter of 2 inches. An n type $In_{0.01}Ga_{0.95}Al_{0.04}N$ clad layer 11 is formed on the substrate 10. An active layer of multiple quantum well thereon includes two layers of $In_{0.02}Ga_{0.8}N$ quantum well layers 12a and a signal layer of $In_{0.05}Ga_{0.95}N$ barrier layer 12b. Reference numeral 13 denotes a p type $In_{0.02}Ga_{0.89}Al_{0.09}N$ clad layer, 14 denotes a p type $In_{0.05}Ga_{0.94}Al_{0.01}N$ contact layer, 15 denotes a p type electrode and 16 denotes an n type electrode. The clad layer 11 of n type $In_{0.01}Ga_{0.95}Al_{0.04}N$ is not limited to the quaternary mixed crystal having Al composition of 0.04 and In composition of 0.01, and it may a ternary mixed crystal of AlGaN or InGaN, or a binary mixed crystal of GaN. Alternatively, the clad layer may be formed of a mixed crystal of quaternary or higher order containing a small amount of other element(s).

In Embodiment 1, the thickness of n type gallium nitride substrate 10 was 100 $\mu$m. The thickness is not limited thereto, and it may be in the range of 5 $\mu$m to 500 $\mu$m. Further, the main surface of substrate 10 may be other crystallographic plane such as a plane.

$In_{0.2}Ga_{0.8}N$ quantum well layer 12a including tow layers, and a single layer of $In_{0.05}Ga_{0.95}N$ barrier layer 12b constituting the active layer of the multiple quantum well structure may have their compositions set in accordance with the desired light emission wavelength. More specifically, when longer light emission wavelength is desired, In composition of quantum well layer 12a should be increased and when shorter wavelength is desired, the In composition should be decreased. Quantum well layer 12a and barrier layer 12b may be formed of a mixed crystal semiconductor of quaternary or higher order containing a small amount of other element such as Al, As or/and P, in addition to the ternary mixed crystal of InGaN. Barrier layer 12b may be formed by simply using GaN.

The clad layer of P type $In_{0.02}Ga_{0.89}Al_{0.09}N$ is not limited to the quaternary mixed crystal having the Al composition of 0.09, and it may be a ternary mixed crystal of AlGaN or InGaN. By decreasing the In composition or increasing the Al composition of the clad layer, the energy gap difference and the refractive index difference between the active layer and the clad layer increase, effectively confining the light and the carriers within the active layer. Thus, ineffective current passing through the active layer can be reduced and the temperature characteristic of the light emitting element can be improved. On the contrary, by increasing the In composition or decreasing the Al composition of the clad layer within such a range that can maintain confinement of the light and the carriers in the active layer, carrier mobility in the clad layer increases, advantageously reducing electrical resistance of the light emitting element. Further, the clad layer may be formed of a mixed crystal semiconductor of quaternary or higher order, including a small amount of other element(s).

An example of the method of fabricating a gallium nitride based semiconductor laser will be described in the following. Though an example utilizing MOCVD method (Organic Metal Chemical Vapor Deposition method) will be described in the following, any method may be used provided that it allows epitaxial growth of the gallium nitride based semiconductor layer. For example, other method of vapor phase growth such as MBE method (Molecular Beam Epitaxy method) and HVPE (Hydride Vapor Phase Epitaxy method) may be utilized.

First, n type gallium nitride substrate 10 having the c plane as a main surface, the thickness of 40 µm and the diameter of 2 inches was placed on a heater in a crystal growth furnace. The substrate 10 was heated to the temperature of 1050° C., and using trimethylgallium (TMG), ammonia ($NH_3$) and silane gas ($SiH_4$) as the raw material gas, an Si doped n type GaN layer 11 having the thickness of 3 µm was grown on the substrate 10.

Thereafter, the substrate temperature was lowered to 800° C., and by using TMG, $NH_3$ and trimethyl indium (TMI) as the raw material gas, $In_{0.02}Ga_{0.8}N$ quantum well layer (having the thickness of 5 nm) 12a, $In_{0.05}Ga_{0.95}N$ barrier layer (having the thickness of 5 nm) 12b and $In_{0.02}Ga_{0.8}N$ quantum well layer (having the thickness of 5 nm) 12a were successively grown, whereby an active layer of the multiple quantum well structure (total thickness of 15 nm) was formed.

The substrate temperature was again increased to 1050° C., and using TMG, TMA, $NH_3$ and cyclopentadienyl magnesium ($Cp_2Mg$) as the raw material gas in a nitrogen atmosphere, an Mg doped p type $Al_{0.1}Ga_{0.9}N$ clad layer 13 having the thickness of 0.7 µm was grown. Thereafter, TMA was removed from the raw material gas, and Mg doped p type GaN contact layer 14 having the thickness of 0.2 µm was grown while keeping the substrate temperature at 1050° C., and thus the gallium nitride based epitaxial wafer was completed.

Thereafter, the wafer was annealed in a nitrogen gas atmosphere at 800° C., so that Mg doped p type layer came to have lower resistance.

Thereafter, by using common metal thin film vapor deposition technique, photolithography and etching technique, a p side electrode 15 of Pd and Au was formed on the surface of p type GaN contact layer 14.

On the rear surface of n type gallium nitride substrate 10, the n type electrode 16 having the structure shown in FIGS. 1A and 1B was formed. At that time, first, an Ti layer was deposited to the thickness of about 1 µm by vacuum vapor deposition method on the rear surface of the n type gallium nitride substrate 10. By photolithography and wet etching using diluted nitric acid or lift off method, the Ti layer was patterned to a lattice having the line width of 3 µm and line space of 60 µm, and thereafter, alloying process was performed for 10 minutes in a nitrogen atmosphere at 400° C., whereby the n type electrode 16 was formed. Here, the electrode coverage ratio of n type electrode 16 on the rear surface of n type gallium nitride substrate 10 was about 9.8%.

The wafer with the electrode fabricated in this manner was divided into light emitting element chips, and the chip was fixed on a base by using an Ag paste, whereby a light emitting element was fabricated.

A DC current of 20 mA was applied to the light emitting element obtained in Embodiment 1, and blue light emission having the peak wavelength of 465 nm and optical output of 3.1 mW was obtained. The operational voltage of the light emitting element at this time was 2.9V. After conduction of DC current of 20 mA for 1000 hours, the optical output of the light emitting element was 2.8 mW, which was 90% of the initial optical output. The operational voltage at that time was 2.9V.

As a comparison for Embodiment 1, the light emitting element was fabricated in the similar manner as Embodiment 1 except that a Ti ohmic electrode having the thickness of 1 µm was formed on the rear surface of n type gallium nitride substrate with the electrode coverage ratio of 100%. When the DC current of 20 mA was supplied to the light emitting element, blue light emission having the peak wavelength of 465 nm and the optical output of 3.0 mW was obtained, with the operational voltage of 2.8V. The optical output after conduction for 1000 hours of the comparative light emitting element was 2.2 mW, which was 73% of the initial optical output, and the operational voltage at that time was 3.1V. More specifically, it is understood that the light emitting element having the electrode coverage ratio of 100% suffers from decrease in optical output after conduction over a long period of time and further it suffers from the increase of the operational voltage, as compared with Embodiment 1.

Embodiment 2

FIG. 2A is a plan view of the gallium nitride based semiconductor light emitting element in accordance with Embodiment 2 of the present invention viewed from the side of the substrate, and FIG. 2B is a cross sectional view showing the stacked layer structure of the light emitting element. The light emitting element of Embodiment 2 was fabricated in the similar manner as Embodiment 1, except that the n type electrode 16 formed on the rear surface of n type gallium nitride substrate 10 having the thickness reduced to 80 µm consisted of a plurality of islands arranged in an array.

Referring to FIGS. 2A and 2B, first, an Hf layer was deposited to the thickness of about 0.5 µm by vacuum vapor deposition method on the rear surface of the n type gallium nitride substrate 10. By photolithography and wet etching using diluted nitric acid or lift off method, the Hf layer was patterned to an array having a plurality of islands each having the diameter of 40 µm arranged at a pitch of 100 µm, and thereafter, alloying process was performed for 5 minutes in a nitrogen atmosphere at 450° C., whereby the n type electrode 16 was formed. Here, the electrode coverage ratio of the n type electrode 16 on the rear surface of n type gallium nitride substrate 10 was about 12.6%.

The wafer with the electrode fabricated in this manner was divided into light emitting element chips, and the chip was fixed on a base by a conductive adhesive, whereby a light emitting element was fabricated.

When a DC current of 20 mA was supplied to the light emitting element obtained in Embodiment 2, blue light emission having the peak wavelength of 465 nm and the optical output of 3.2 mW was obtained, and the operational voltage of the light emitting element at that time was 2.9V. The optical output after conduction for 1000 hours was 2.9 mW, which was 91% of the initial optical output, and the operational voltage at that time was 2.9V.

Embodiment 3

FIG. 3A is a plan view of the gallium nitride based semiconductor light emitting element in accordance with Embodiment 3 of the present invention viewed from the side of the substrate, and FIG. 3B is a cross sectional view showing the stacked layer structure of the light emitting element. In Embodiment 3, the light emitting element was fabricated in the similar manner as Embodiment 1, except that a supplemental electrode layer 16b is provided on the n type ohmic contact electrode layer 16a as the n type electrode on the rear surface of n type gallium nitride substrate 10 having the thickness reduced to 60 $\mu$m.

More specifically, on the rear surface of n type gallium nitride substrate 10, an Zr layer was deposited to the thickness of about 0.1 $\mu$m by vacuum vapor deposition method. By photolithography and wet etching using diluted nitric acid or lift off method, the Zr layer was patterned to a lattice having the line width of 15 $\mu$m and line space of 160 $\mu$m, and thereafter alloying process was performed for 10 minutes in a nitrogen atmosphere at 400° C., whereby an n type ohmic contact electrode layer 16a was formed. In the similar manner, an Ag layer was deposited to the thickness of about 1 $\mu$m to cover the n type ohmic contact electrode layer 16a. By photolithography and wet etching using diluted nitric acid or lift off method, the Ag layer was patterned to a lattice having the line width of 40 $\mu$m and line space of 160 $\mu$m, whereby an n type supplemental electrode layer 16b was formed. At this time, the electrode coverage layer of n type supplemental electrode layer 16b of Ag on the rear surface of n type gallium nitride substrate 10 was about 44%.

The wafer with the electrode fabricated in this manner was divided into light emitting element chips, and the chip was fixed on a base by using a conductive adhesive, whereby a light emitting element was fabricated.

When a DC current of 20 mA was supplied to the light emitting element obtained in Embodiment 3, blue light emission having the peak wavelength of 465 nm and the optical output of 3.4 mW was obtained, and the operational voltage of the light emitting element at that time was 2.8V. The optical output after conduction for 1000 hours was 2.8 mW, which was 82% of the initial optical output, and the operational voltage at that time was 2.8V.

Embodiment 4

FIG. 4A is a plan view of the gallium nitride based semiconductor light emitting element in accordance with Embodiment 4 of the present invention viewed from the side of the substrate, and FIG. 4B is a cross sectional view showing the stacked layer structure of the light emitting element. In Embodiment 4, a light emitting element was fabricated in the similar manner as Embodiment 3, except that as an electrode on the rear surface of n type gallium nitride substrate 10 having the thickness reduced to 40 $\mu$m, a supplemental electrode layer 16b was provided on and rotated by 45° relative to the n type ohmic contact electrode layer 16a.

More specifically, an La layer was deposited to the thickness of about 0.1 $\mu$m by vacuum vapor deposition method on the rear surface of n type gallium nitride substrate 10. By photolithography and wet etching using diluted nitric acid or lift off method, the La layer was patterned to a lattice having the line width of 10 $\mu$m and line space of 120 $\mu$m, and thereafter alloying process was performed for 10 minutes in a nitrogen atmosphere at 400° C., whereby the n type ohmic contact electrode layer 16a was formed. Similarly, an Al layer was deposited to the thickness of about 0.2 $\mu$m on the rear surface of substrate 10. By photolithography and wet etching using diluted nitric acid or lift off method, the Al layer was patterned to a lattice having the line width of 14 $\mu$m and line space of 170 $\mu$m, whereby n type supplemental electrode layer 16b was formed. At this time, the electrode coverage ratio of n type ohmic contact electrode layer 16a and n type supplemental electrode layer 16b on the rear surface of n type gallium nitride substrate 10 was about 17%.

When a DC current of 20 mA was supplied to the light emitting element obtained in Embodiment 4, blue light emission having the peak wavelength of 465 nm and optical output of 3.5 mW was obtained, and the operational voltage of the light emitting element at that time was 2.8V. The optical output after conduction for 1000 hours was 3.1 mW, which was 89% of the initial optical output, and the operational voltage at that time was 2.9V.

Embodiment 5

FIG. 5A is a plan view of the gallium nitride based semiconductor light emitting element in accordance with Embodiment 5 of the present invention viewed from the side of the substrate, and FIG. 5B is a cross sectional view showing the stacked layer structure of the light emitting element. In Embodiment 5, a light emitting element was fabricated in the similar manner as Embodiment 1, except that as an electrode on the rear surface of n type gallium nitride substrate 10 having the thickness increased to 200 $\mu$m, a lattice-shaped supplemental electrode layer 16b is provided on the island-shaped n type ohmic contact electrode layer 16a.

More specifically, an yttrium (Y) layer was deposited to the thickness of about 0.2 $\mu$m by vacuum vapor deposition method on the rear surface of n type gallium nitride substrate 10. By photolithography and wet etching using diluted nitric acid or lift off method, the Y layer was patterned to an array having rectangles of 30 $\mu$m×40 $\mu$m at a pitch of 100 $\mu$m, and thereafter alloying process was performed for 10 minutes in a nitrogen atmosphere at 400° C., whereby n type ohmic contact electrode layer 16 was formed. In the similar manner, a tungsten (W) layer was deposited to the thickness of about 1 $\mu$m to cover the n type ohmic contact electrode layer 16a. By photolithography and wet etching using diluted nitric acid or lift off method, the W layer was patterned to a lattice having the line width of 20 $\mu$m and line space of 100 $\mu$m, whereby n type supplemental electrode layer 16b was formed. At this time, the electrode coverage ratio of n type ohmic contact electrode layer 16a and n type supplemental electrode layer 16b on the rear surface of n type gallium nitride substrate 10 was about 38%.

A wafer with the electrode fabricated in this manner was divided into light emitting element chips, and the chip was fixed on a base by using a conductive adhesive, whereby a light emitting element was fabricated.

When a DC current of 20 mA was supplied to the light emitting element obtained in Embodiment 5, blue light emission having the peak wavelength of 465 nm and optical output of 3.3 mW was obtained, and the operational voltage of the light emitting element at that time was 2.8V. The optical output after conduction for 1000 hours was 2.7 mW, which was 82% of the initial optical output, and the operational voltage at that time was 2.8V.

Embodiment 6

FIG. 6A is a plan view of the gallium nitride based semiconductor light emitting element in accordance with Embodiment 6 of the present invention viewed from the side of the substrate, and FIG. 6B is a cross sectional view showing the stacked layer structure of the light emitting element. In Embodiment 6, the light emitting element was fabricated in the similar manner as Embodiment 1, except that as an electrode on the rear surface of n type gallium nitride substrate 10 having the thickness increased to 400 µm, an island-shaped supplemental electrode layer 16b was provided on the lattice-shaped n type ohmic contact electrode layer 16a.

More specifically, on the rear surface of n type gallium nitride substrate 10, an Sc layer was deposited to the thickness of about 0.2 µm by vacuum vapor deposition method. By photolithography and wet etching using diluted nitric acid or lift off method, the Sc layer was patterned to a lattice having the line width of 15 µm and line space of 50 µm, and thereafter alloying process was performed for 10 minutes in a nitrogen atmosphere at 400° C., whereby an n type ohmic contact electrode layer 16a was formed. Similarly, a platinum (Pt) layer was deposited to the thickness of about 1 µm to cover the n type ohmic contact electrode layer 10a. By photolithography and wet etching using diluted nitric acid or lift off method, the Pt layer was patterned to an array having a plurality of square islands with each side of 30 µm arranged at a pitch of 50 µm, whereby the n type supplemental electrode layer 16b was formed. At this time, the electrode coverage ratio of n type ohmic contact electrode layer 16a and n type supplemental electrode layer 16b on the rear surface of n type gallium nitride substrate 10 was 60%.

The wafer with the electrode fabricated in this manner was divided into light emitting element chips, and the chip was fixed on the base by using a conductive adhesive, whereby a light emitting element was fabricated.

When a DC current of 20 mA was supplied to the light emitting element obtained in Embodiment 6, blue light emission having the peak wavelength of 465 nm and the optical output of 3.1 mW was obtained, and the operational voltage of the light emitting element at that time was 2.8V. The optical output after conduction for 1000 hours was 2.4 mW, which was 77% of the initial optical output, and the operational voltage was 2.9V.

Embodiment 7

FIG. 7A is a plan view of the gallium nitride based semiconductor light emitting element in accordance with Embodiment 7 of the present invention viewed from the side of the substrate, and FIG. 7B is a cross sectional view showing the stacked layer structure of the light emitting element. In Embodiment 7, the light emitting element was fabricated in the similar manner as Embodiment 1, except that as the electrode on the rear surface the n type gallium nitride substrate having the thickness reduced to 70 µm, an electrode pad layer 16b for wire bonding was provided on the lattice-shaped n type ohmic contact electrode layer 16a.

More specifically, an Hf layer was deposited to the thickness of about 0.2 µm by vacuum vapor deposition method on the rear surface of n type gallium nitride substrate 10. By photolithography and wet etching using diluted nitric acid or lift off method, the Hf layer was patterned to a lattice having the line width of 30 µm and line space of 100 µm, and thereafter alloying process was performed for 10 minutes in a nitrogen atmosphere at 400° C., whereby n type ohmic contact electrode layer 16a was formed. Similarly, an Au layer was deposited to the thickness of about 1 µm to cover n type ohmic contact electrode layer 16a. By photolithography and wet etching using diluted nitric acid or lift off method, the Au layer was patterned to an island having the diameter of 110 µm, and thus n type supplemental electrode layer 16b was formed. At this time, the electrode coverage ratio of n type ohmic contact electrode layer 16a and n type supplemental electrode layer 16b on the rear surface of n type gallium nitride substrate 10 was about 54%.

The wafer with the electrode fabricated in this manner was divided into light emitting element chips, and the chip was fixed on a base with the p side electrode facing downward, using a conductive adhesive, whereby a light emitting element was fabricated.

When a DC current of 20 mA was supplied to the light emitting element obtained in Embodiment 7, blue light emission having the peak wavelength of 465 nm and optical output of 3.1 mW was obtained, and the operational voltage of the light emitting element at that time was 2.8V. The optical output after conduction of 1000 hours was 2.5 mW, which was 81% of the initial optical output, and the operational voltage at that time was 2.8V.

As described above, according to the present invention, as the n type electrode is formed not on the entire region but partially on the rear surface of n type gallium nitride substrate, it becomes possible to provide blue light emitting element having high reliability and high brightness with high production efficiency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A gallium nitride based light emitting element, comprising an n type electrode formed on one main surface of an n type gallium nitride substrate, wherein area ratio of said n type electrode with respect to the area of said one main surface is set to be in a range of at least 5% and at most 60%, and said n type electrode includes an n type ohmic electrode layer for introducing current, wherein thickness of said substrate is at least 40 µm.

2. The gallium nitride based light emitting element according to claim 1, wherein said n type electrode further includes a supplemental electrode layer electrically in contact with said ohmic electrode layer.

3. The gallium nitride based light emitting element according to claim 2, wherein said ohmic electrode layer and said supplemental electrode layer have mutually different two-dimensional shapes.

4. The gallium nitride based light emitting element according to claim 1, wherein said ohmic electrode layer contains any of Ti, Sc, La, Y, Hf and Zr.

5. The gallium nitride based light emitting element according to claim 2, wherein said supplemental electrode contains any of Pt, Al, Ag, Au and W.

6. The gallium nitride based light emitting element according to claim 1, wherein thickness of said n type electrode is at least 0.3 µm and at most 2 µm.

* * * * *